United States Patent
Huang (10) Patent No.: US 8,798,953 B2
(45) Date of Patent: Aug. 5, 2014

(54) CALIBRATION METHOD FOR RADIO FREQUENCY SCATTERING PARAMETER MEASUREMENT APPLYING THREE CALIBRATORS AND MEASUREMENT STRUCTURE THEREOF

(75) Inventor: Chien-Chang Huang, Chung-Li (TW)

(73) Assignee: Yuan Ze University, Taoyuan County (TW)

( * ) Notice: Subject to any disclaimer, the term of this patent is extended or adjusted under 35 U.S.C. 154(b) by 404 days.

(21) Appl. No.: 13/223,410

(22) Filed: Sep. 1, 2011

(65) Prior Publication Data

US 2013/0060501 A1 Mar. 7, 2013

(51) Int. Cl.
G01R 35/00 (2006.01)
G01R 27/32 (2006.01)

(52) U.S. Cl.
CPC .................. *G01R 27/32* (2013.01); *G01R 35/005* (2013.01)
USPC ............ 702/106; 702/107; 324/601; 324/638

(58) Field of Classification Search
USPC .......................... 702/106, 107; 324/601, 638
See application file for complete search history.

(56) References Cited

U.S. PATENT DOCUMENTS

| 5,608,330 A * | 3/1997 | Heuermann et al. .......... 324/601 |
| 2010/0176789 A1 * | 7/2010 | Zoughi et al. .............. 324/76.13 |
| 2011/0151596 A1 * | 6/2011 | Cho ................................. 438/17 |

OTHER PUBLICATIONS

Huang et al., "Accuracy Improvement for Line-Series-Shunt Calibration in Broadband Scattering-Parameter Measurements With Applications of On-Wafer Device Characterization" IEEE Transactions on Microwave Theory and Techniques, vol. 58, No. 9, Sep. 2010, pp. 2497-2503, Date of publication Aug. 12, 2010 (see p. 2497 footnote).*

Huang & Lin, "A Novel Calibration Algorithm With Unknown Line-Series-Shunt Standards for Broadband S-Parameter Measurements" IEEE Transactions on Instrumentation and Measurement, vol. 57, No. 5, May 2008, pp. 891-896.*

Engen et al., "Thru-Reflect-Line: An Improved Technique for Calibrating the dual Six-Port Automatic Network Analyzer" IEEE Transactions Microwave Theory and Techniques, vol. MTT-27, No. 12, Dec. 1979.*

Dylan F. Williams, Jack C.M. Wang, Uwe Arz, An Optimal Vector-Network-Analyzer Calibration Algorithm, IEEE Transactions on Microwave Theory and Techniques, vol. 51, No. 12, Dec. 2003, p. 23941-p. 2401.

(Continued)

*Primary Examiner* — Mohamed Charioui
*Assistant Examiner* — John Kuan
(74) *Attorney, Agent, or Firm* — Ming Chow; Sinorica, LLC (57) ABSTRACT

A calibration method for radio frequency scattering parameter measurement applying three calibrators and measurement structure thereof, comprising a transmission line segment calibrator, an offset series device calibrator, an offset shunt device calibrator and a tested object measuring instrument, wherein the length of the transmission lines for the offset series device calibrator and the offset shunt device calibrator is equal to the one of the transmission line for the tested object measuring instrument such that the offset series device calibrator, the offset shunt device calibrator and the tested object measuring instrument have the identical error boxes, and after having acquired the scattering parameter matrix of the error box by means of the calibration method, it is possible to connect the tested electronic device onto the tested object measuring instrument and perform operations on uncorrected measurement data thereof thereby obtaining the radio frequency scattering parameter of the tested object.

5 Claims, 5 Drawing Sheets

(56) References Cited

OTHER PUBLICATIONS

Xiaoyun Wei, Guofu Niu, Susan L. Sweeney, Qingqing Liang, Xudong Wang, Stewart S. Taylor, A General 4-Port Solution for 110 GHz On-Wafer Transistor Measurements With or Without Impedance Standard Substrate (ISS) Calibration, IEEE Transactions on Electron Devices, vol. 54, No. 10, Oct. 2007, p. 2706-p. 2714.

* cited by examiner

CALIBRATION METHOD FOR RADIO FREQUENCY SCATTERING PARAMETER MEASUREMENT APPLYING THREE CALIBRATORS AND MEASUREMENT STRUCTURE THEREOF

BACKGROUND OF THE INVENTION

1. Field of the Invention

The present invention relates to a calibration method for radio frequency scattering parameter measurement and measurement structure thereof. In particular, the present invention relates to a calibration method for radio frequency scattering parameter measurement de-embedding and measurement structure thereof suitable for one-tier semiconductor wafer devices or other substrate devices.

2. Description of Related Art

Typically, it is difficult to directly measure the voltage and current of a signal in the radio frequency microwave frequency band, thus in such a frequency band, it is necessary to discuss in the form of wave with actions through incidence, reflection and absorption thereby facilitating measurements of scattering parameters thereof. Because the entire measurement system needs to perform a sequence of complicated processes, the measurement calibration is consequently required in order to improve the accuracy of measurements. Herein the measurement errors can be mathematically characterized by using an error matrix, and such errors can be roughly divided into three major categories; i.e., random, drift and system errors, among which the scattering parameter of the system error can be effectively detected by a network analyzer under a stable measurement environment, further obtaining the error thereof, thus completing the measurement calibration.

In practice, the implementation procedure for such a calibration method is essentially to adjust the initial status of the instrument after startup to a user-defined actual measurement environment so as to eliminate any additional errors other than the tested object; while currently available radio frequency scattering parameter measurement for semiconductor wafer devices typically operates in a two-tier approach, comprising the following steps:

1. performing calibrations on the system before starting the measurement thereby eliminating the effect caused by the measuring instrument and environment; hence it first uses a probe in conjunction with an Impedance Standard Substrate (ISS) for calibration, whose calibration method can be SOLT (Short-Open-Load-Thru) or LRM (Line-Reflect-Match), and then moves the measurement reference plane to the tip of the probe, but a small segment of connecting line exists between the probe pad and the tested device within the wafer, and the capacitive effect in the probe pad of large area may not be effectively calibrated;

2. further performing calibrations on the additional dummy structure (e.g., Short, Open, Thru etc.) of the wafer so as to remove the effects caused by the pad and the connecting line, i.e., the de-embedding procedure, thus the major purpose of de-embedding is to remove the effect of the test clamping fixture from the measurement data in raw test results so as to acquire the most primitive characterization of the device.

However, such a two-tier measurement approach has the following drawbacks:

1. the high frequency feature of the additional dummy structure on the wafer may not be conveniently appreciated, and in case it is assumed to be an ideal feature, significant errors may be undesirably introduced at high frequency in the de-embedding process;

2. the two-tier measurement consumes much the wafer probe test time, consequently, as applying to massive tests, it becomes comparatively critical;

3. since the Impedance Standard Substrate (ISS) is expensive and the feature thereof may degrade after each test due to scratches on its pad caused by the probe, the substrate needs to be replaced after a certain cycles of use, thus adversely elevating the test cost.

Regarding to the aforementioned drawbacks, a few literatures have proposed certain solutions therefore, including:

1. *IEEE Trans. Electron Devices*, vol. 54, no. 10, pp. 2706-2714, October 2007, describing the use of a one-tier measurement for de-embedding operation at the cost of five dummy structures (Open, Short, Thru, Left, Right), so the precision thereof may be compromised in comparison with the two-tier approach.

2. *IEEE Trans. Microwave Theory Tech.*, vol. 51, pp. 2391-2401, December 2003, describing a Multiline Thru-Reflect-Line (TRL) calibration method developed by NIST (National Institute of Standards and Technology), which enables completion of calibration and de-embedding process in a one-tier fashion, but presents a disadvantage of requirement on multiple transmission line segments which significantly occupies valuable wafer area.

As a result, it would be an optimal solution to provide a calibration method for radio frequency scattering parameter measurement and measurement structure thereof which can perform the de-embedding process in a one-tier radio frequency scattering parameter measurement of semiconductor wafer devices or other substrate devices without using the Impedance Standard Substrate but requiring simply the application of three calibrators for operations.

SUMMARY OF THE INVENTION

The objective of the present invention is to provide a calibration method for radio frequency scattering parameter measurement which improves the accuracy of scattering parameter measurements and uses a one-tier measurement for the de-embedding process.

Another objective of the present invention is to provide a calibration method for radio frequency scattering parameter measurement which applies the L-OS-OT (Line/Offset-Series/Offset-Shunt) calibration method to perform wideband measurements and uses the known conditions offered by the calibrators to solve the same or more number of the unknown variables thereby achieving the objective of self-calibration.

To achieve the aforementioned objective, a calibration method for radio frequency scattering parameter measurement and measurement structure thereof, capable of self-calibration, is provided, wherein the measurement structure for radio frequency scattering parameter comprises a transmission line segment calibrator, an offset series device calibrator, an offset shunt device calibrator and a tested object measuring instrument, wherein the length of the transmission lines for the offset series device calibrator and the offset shunt device calibrator is equal to the one of the transmission line for the tested object measuring instrument such that the offset series device calibrator, the offset shunt device calibrator and the tested object measuring instrument have the identical error boxes, and after having acquired the scattering parameter matrix of the error box by means of the calibration method, it is possible to connect the tested electronic device onto the tested object measuring instrument and perform operations on uncorrected measurement data thereof thereby obtaining the radio frequency scattering parameter of the tested object.

More specifically, said calibration method for radio frequency scattering parameter measurement can remove the introduced errors during measurements, and characteristics of such errors can be expressed by means of mathematical models, in which, after measurements on the transmission line segment calibrator, the offset series device calibrator and the offset shunt device calibrator, it is possible to input into the mathematical model so as to solve all error parameters by calculations, and through repeated operations, the error value required for calibration can be obtained thereby further acquiring the parameter value of the actual tested object.

More specifically, said transmission line segment calibrator comprises two transmission lines and a transmission line segment, in which the transmission line segment is connected between such two transmission lines.

More specifically, said offset series device calibrator comprises two transmission lines, an offset transmission line and a series resistor, in which the offset transmission line and the series resistor are connected between the two transmission lines.

More specifically, said offset shunt device calibrator comprises two transmission lines, an offset transmission line and a shunt resistor, in which the offset transmission line and the shunt resistor are connected between the two transmission lines.

More specifically, the length of the transmission lines for said offset series device calibrator and offset shunt device calibrator is equal to the one of the transmission line for said tested object measuring instrument such that the offset series device calibrator, the offset shunt device calibrator and the tested object measuring instrument have the identical error boxes.

More specifically, the length of the offset transmission line for said offset series device calibrator differs from the one of the offset transmission line for said offset shunt device calibrator.

More specifically, said transmission line segment calibrator, offset series device calibrator, offset shunt device calibrator and tested object measuring instrument can be applied to silicon substrates, compound semiconductor substrates (GaAs, GaN, InP etc.) or ceramic/FR-4 (epoxy glass fiber board) substrates, with the microstrip or coplanar waveguide used as the connecting transmission line.

DETAILED DESCRIPTION OF THE PREFERRED EMBODIMENTS

The aforementioned and other technical contents, aspects and effects in relation with the present invention can be clearly appreciated through the detailed descriptions concerning the preferred embodiments of the present invention in conjunction with the appended drawings.

Figure 1A:
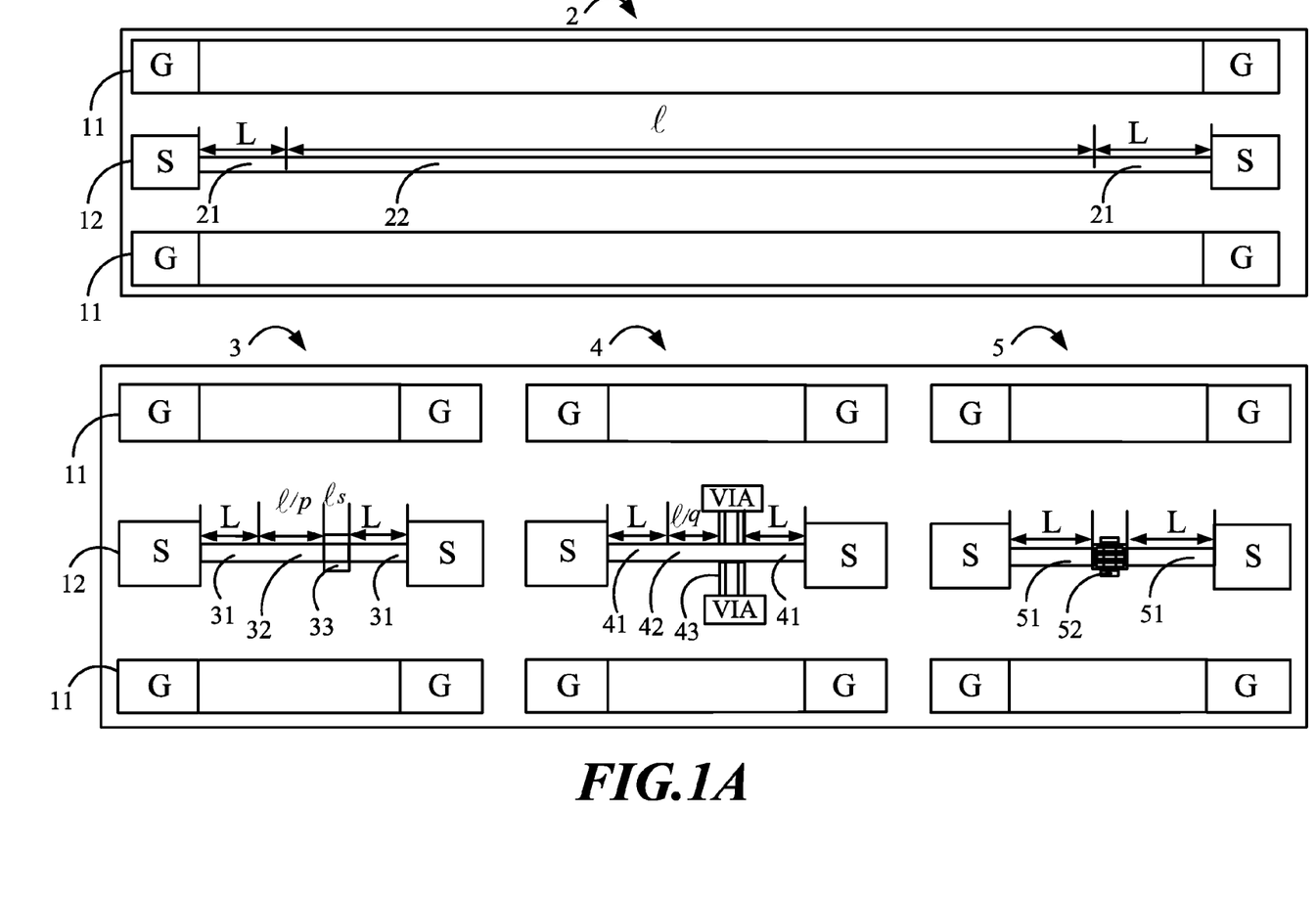
FIG. 1A shows a structure diagram of the microstrip layout used in the calibration method for radio frequency scattering parameter measurement applying three calibrators and measurement structure thereof according to the present invention.
Figure 1B:
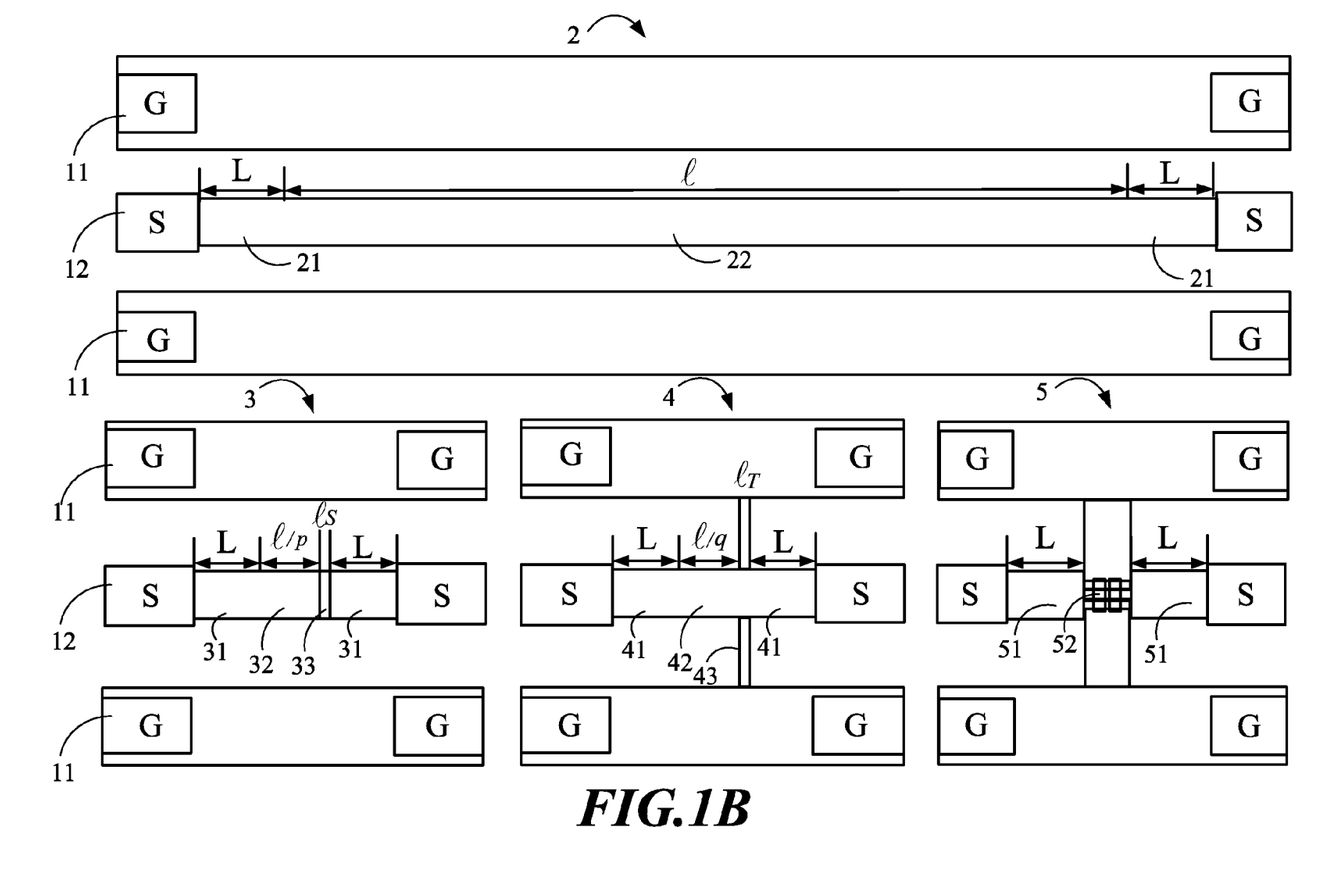
FIG. 1B shows a structure diagram of the coplanar waveguide layout used in the calibration method for radio frequency scattering parameter measurement applying three calibrators and measurement structure thereof according to the present invention.
Figure 2:
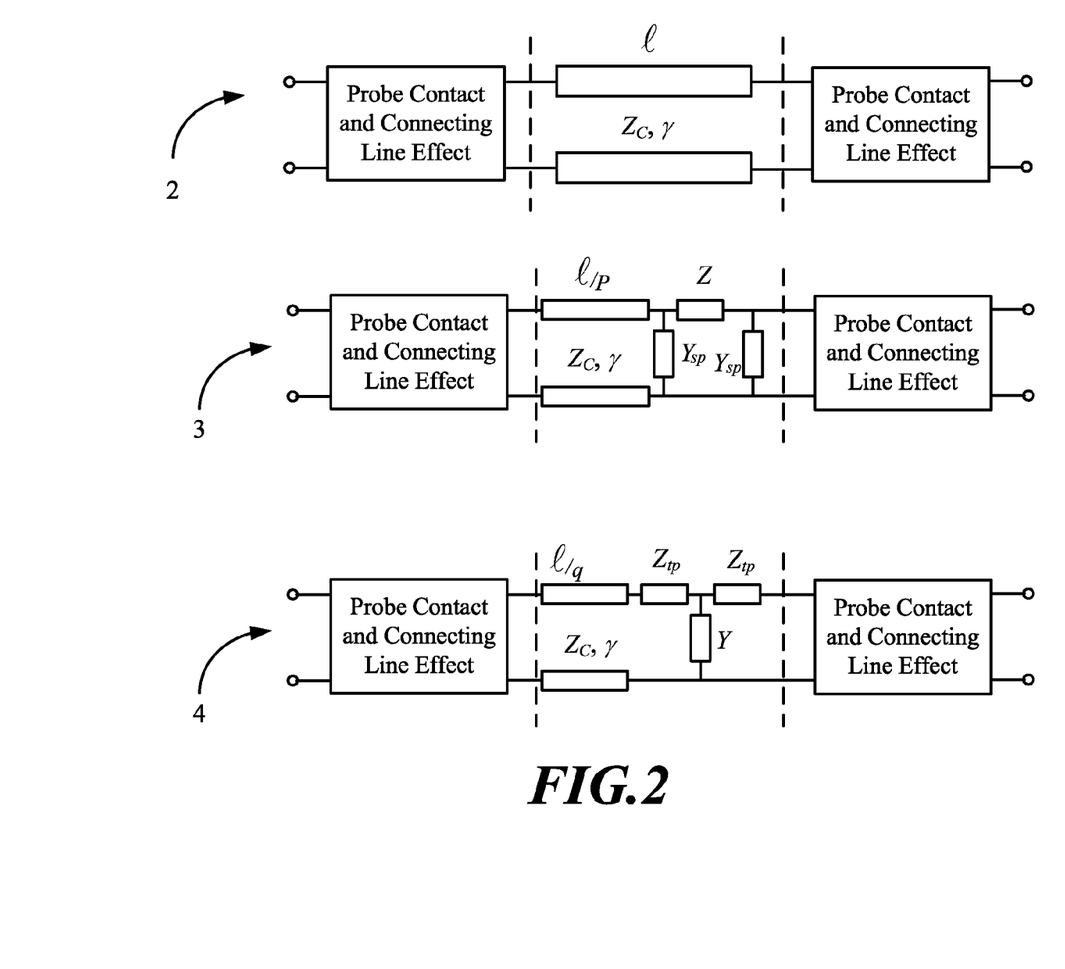
FIG. 2 shows an equivalent circuit diagram of the calibration method for radio frequency scattering parameter measurement applying three calibrators and measurement structure thereof according to the present invention.

Refer initially to FIGS. 1A, 1B and 2, wherein a structure diagram for the microstrip layout, a structure diagram for the coplanar waveguide layout and an equivalent circuit diagram for the calibrator of the calibration method for radio frequency scattering parameter measurement according to the present invention are respectively shown, and it can be seen that the measurement structure applied in the calibration method for radio frequency scattering parameter measurement according to the present invention uses a microwave probe as the contact interface for microwave signal transmissions, and the microwave probe includes at least a ground 11 and a signal end 12, in which the measurement structure applied in the calibration method for radio frequency scattering parameter measurement comprises:

a transmission line segment calibrator 2, in which the microwave probe (the ground 11 and the signal end 12) contacts the transmission line segment calibrator 2, and the transmission line segment calibrator 2 consists of two transmission lines 21 and a transmission line segment 22, in which the transmission line segment 22 is connected between the two transmission lines 21, and the transmission lines 21 are connected to the signal end 12 of the microwave probe thereby performing measurements on the device characteristics of the transmission line segment 22;

an offset series device calibrator 3, in which the microwave probe (the ground 11 and the signal end 12) contacts the offset series device calibrator 3, and the offset series device calibrator 3 consists of two transmission lines 31, an offset transmission line 32 and a series resistor 33, in which the offset transmission line 32 and the series resistor 33 are connected between the two transmission lines 31, and the transmission lines 31 are connected to the signal end 12 of the microwave probe thereby performing measurements on the characteristics of the offset transmission line 32 and the series resistor 33;

an offset shunt device calibrator 4, in which the microwave probe (the ground 11 and the signal end 12) contacts the offset shunt device calibrator 4, and the offset shunt device calibrator 4 consists of two transmission lines 41, an offset transmission line 42 and a shunt resistor 43, in which the offset transmission line 42 and the shunt resistor 43 are connected between the two transmission lines 41, and the transmission lines 41 are connected to the signal end 12 of the microwave probe thereby performing measurements on the characteristics of the offset transmission line 42 and the shunt resistor 43;

a tested object measuring instrument 5, in which the microwave probe (the ground 11 and the signal end 12) contacts the tested object measuring instrument 5, and the tested object measuring instrument 5 consists of two transmission lines 51 and a tested device 52, in which the tested device 52 is connected between the two transmission lines 51 and the two transmission lines 51 are connected to the signal end 12 of the microwave probe thereby performing measurements on the device characteristics of the tested device 52 (the tested device is shown as an FET device in FIGS. 1A and 1B).

It should be noted that, as shown in FIG. 2, the equation for the equivalent circuit of the series device calibrator 3 (where $y_{sp}$ is a high frequency parasitic effect device) includes:

$$z \equiv \frac{Z}{Z_C},\ y_{sp} \equiv \frac{Y_{sp}}{Y_C},\ Y_C \equiv \frac{1}{Z_C},$$

and the equation for the equivalent circuit of the shunt device calibrator 4 (where $z_{tp}$ is a high frequency parasitic effect device) includes:

$$y \equiv \frac{Y}{Y_C},\ z_{tp} \equiv \frac{Z_{tp}}{Z_C},\ Y_C \equiv \frac{1}{Z_C}.$$

It should be noted that the transmission lines 21 in the transmission line segment calibrator 2, the transmission lines 31 in the offset series device calibrator 3, the transmission lines 41 in the offset shunt device calibrator 4 and the transmission lines 51 in the tested object measuring instrument 5 have the same length, such that the transmission line segment calibrator 2, the offset series device calibrator 3 and the offset shunt device calibrator 4 have the identical error box as the tested object measuring instrument 5.

It should be noted that the length of the offset transmission line 32 in the offset series device calibrator 3 differs from the length of the offset transmission line 42 in the offset shunt device calibrator 4.

It should be noted that the transmission line segment calibrator 2, the offset series device calibrator 3, the offset shunt device calibrator 4 and the tested object measuring instrument 5 can be disposed on a silicon substrate, a compound semiconductor (GaAs, GaN, InP etc.) substrate or a ceramic/FR-4 (epoxy glass fiber board) substrate.

It should be noted that the transmission line segment calibrator 2, the offset series device calibrator 3, the offset shunt device calibrator 4 and the tested object measuring instrument 5 can use the microstrip or the coplanar waveguide as the connection transmission line, as shown in FIG. 1A, wherein such calibrators (i.e., the transmission line segment calibrator 2, the offset series device calibrator 3 and the offset shunt device calibrator 4) and the tested object measuring instrument 5 use the microstrip as the connection transmission line; and alternatively, as shown in FIG. 1B, wherein the calibrators 2, 3, 4 and the tested object measuring instrument 5 apply the coplanar waveguide as the connection transmission line.

It should be noted that the microwave probe is a high frequency probe and the type thereof can be G-S-G-S-G, G-S-S-G, G-S-G (Ground-Signal-Ground) or G-S (Ground-Signal).

Figure 3:
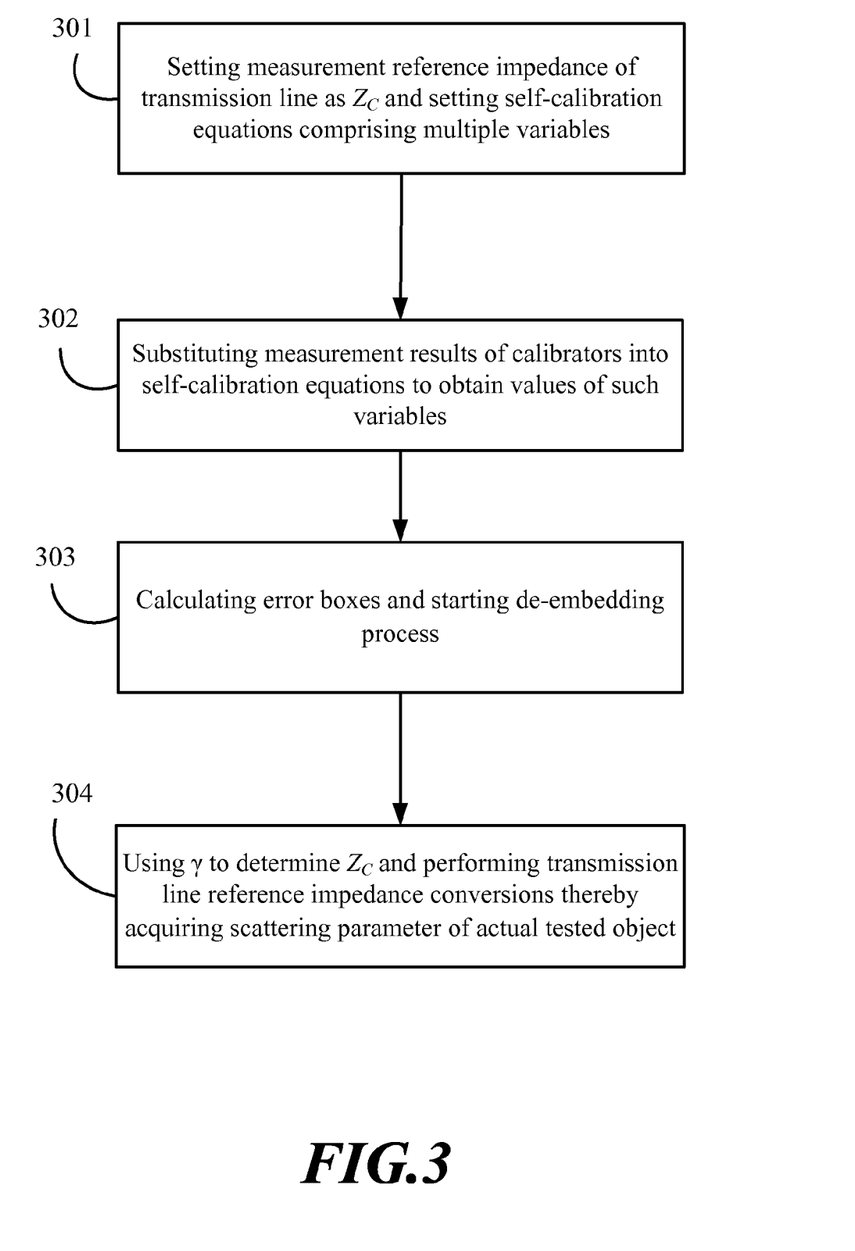
FIG. 3 shows a calibration operation flowchart of the calibration method for radio frequency scattering parameter measurement applying three calibrators and measurement structure thereof according to the present invention.

Refer next to FIG. 3, wherein an operation flowchart for the calibration in the calibration method for radio frequency scattering parameter measurement according to the present invention is shown, and it can be seen that, from the chart, the calibration method for radio frequency scattering parameter measurement can apply the known conditions provided by the calibrators to solve the same or more number of the unknown variables, in which the calibration flow for the calibration method for radio frequency scattering parameter measurement comprises the following steps:

initially, setting the measurement reference impedance of the transmission line to $Z_C$, and setting a self-calibration equation including multiple variables t ($e^{\gamma l}$), z, y, $z_{tp}$, $y_{sp}$ (301) ($\gamma$ indicates the propagation constant of the transmission line, l the length of the transmission line segment in the transmission line segment calibrator, p the ratio of the transmission line lengths for the transmission line segment 22 and the offset transmission line 32, q the ratio of the transmission line lengths for the transmission line segment 22 and the offset transmission line 42, z the standardized impedance of the series device calibrator, y the standardized admittance of the shunt device calibrator, and $z_{tp}$, $y_{sp}$ the high frequency parasitic effect devices); thus such a self-calibration equation can be expressed as below:

$$f_1 = [1 - y_{sp} - z(1 - y_{sp})^2/2] \cdot t^{(1-1/p)} + \qquad (1)$$
$$[1 + y_{sp} + z(1 + y_{sp})^2/2] \cdot t^{-(1-1/p)} = \text{trace}\{[M_{OS,f}][M_L]^{-1}\}$$

$$f_2 = [1 - z_{tp} - y(1 - z_{tp})^2/2] \cdot t^{(1-1/q)} + \qquad (2)$$
$$[1 + z_{sp} + y(1 + z_{tp})^2/2] \cdot t^{-(1-1/q)} = \text{trace}\{[M_{OT,f}][M_L]^{-1}\}$$

$$f_3 = -[y_{sp} - z(1 - y_{sp})^2/2][z_{tp} - y(1 - z_{tp})^2/2]\left[t^{(1/p-1/q)} + t^{-(1/p-1/q)}\right] + \qquad (3)$$
$$[1 - y_{sp} - z(1 - y_{sp})^2/2][1 + z_{tp} + y(1 + z_{tp})^2/2] \cdot t^{-(1/p-1/q)} +$$
$$[1 + y_{sp} + z(1 + y_{sp})^2/2][1 - z_{tp} - y(1 - z_{tp})^2/2] \cdot$$
$$t^{(1/p-1/q)} = \text{trace}\{[M_{OS,f}][M_{OT,f}]^{-1}\}$$

$$f_4 = 2[1 - y_{sp} - z(1 - y_{sp})^2/2][1 + y_{sp} + z(1 + y_{sp})^2/2] + \qquad (4)$$
$$[y_{sp} - z(1 - y_{sp}^2)/2]^2 \cdot \left[t^{2/p} + t^{-2/p}\right] = \text{trace}\{[M_{OS,f}][M_{OS,r}]^{-1}\}$$

$$f_5 = 2[1 - z_{tp} - y(1 - z_{tp})^2/2][1 + z_{tp} + y(1 + z_{tp})^2/2] + \qquad (5)$$
$$[z_{tp} - y(1 - z_{tp}^2)/2]^2 \cdot \left[t^{2/q} + t^{-2/q}\right] = \text{trace}\{[M_{OT,f}][M_{OT,r}]^{-1}\}$$

in conjunction with the measurement results from the transmission line segment calibrator, the offset series device calibrator and the offset shunt device calibrator, substituting them into the aforementioned self-calibration equation and using the Newton-Raphson method to acquire the values of t ($e^{\gamma l}$), z, y, $z_{tp}$, $y_{sp}$ (302);

calculating the error boxes and starting the de-embedding process (303) (the de-embedding process allows to obtain the scattering parameter of the tested object, and in this case the characteristic impedance of the transmission line acts as the reference impedance);

finally, using $\gamma$ to determine $Z_C$ and performing transmission line reference impedance conversion from $Z_C$ to $Z_0$, typically 50Ω, thereby acquiring the scattering parameter of the actual tested object based on the reference impedance of $Z_0$ (304).

It should be noted that, in the self-calibration equation illustrated as the Flowchart 1, [M] represents the transmission matrix of the measurement, and subscripts L, OS and OT respectively indicates the three calibrators, Line, Offset-Series and Offset-Shunt; in addition, the subscript f means the forward measurement from the left-side port 1 to the right-side port 2 of the standard device, while the subscript r indicates the reverse measurement from the left-side port 2 to the right-side port 1 of the standard device.

Figure 4:
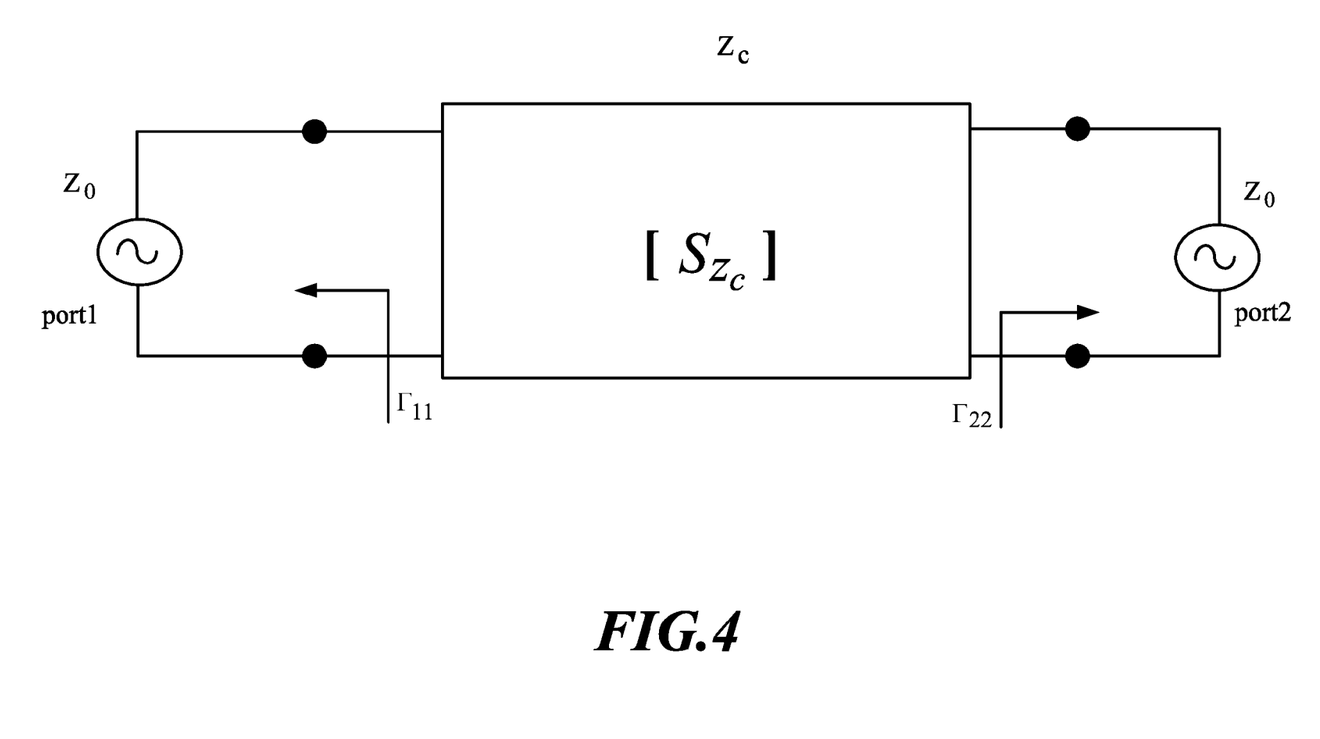
FIG. 4 shows a two-port network architecture diagram of the calibration method for radio frequency scattering parameter measurement applying three calibrators and measurement structure thereof according to the present invention.

It should be noted that, referring to FIG. 4, an architecture diagram for the two-port network of integral measurement is shown, in which the characteristic impedance of the transmission line in the network is $Z_C$, the characteristic impedance of the network analyzer is $Z_0$, and the characteristic impedance can be converted from $Z_C$ to $Z_0$ by means of a conversion relationship equation thus obtaining the scattering parameter of the actual tested object, wherein the conversion relationship equation can be written as below:

$$[D_{Z_0}] = \frac{1}{1-\Gamma^2}\begin{bmatrix} 1 & \Gamma \\ \Gamma & 1 \end{bmatrix} \cdot [D_{Z_C}] \cdot \begin{bmatrix} 1 & -\Gamma \\ -\Gamma & 1 \end{bmatrix} \quad (6)$$

in which $[D_{Z_0}]$ and $[D_{Z_C}]$ respectively indicates the transmission matrix before and after conversion, with $\Gamma$ defined as:

$$\Gamma = \frac{Z_C - Z_0}{Z_C + Z_0} \quad (7)$$

It should be noted that, in STEP 4 (the numeral 304 in FIG. 3), if it is required to convert the reference impedance to the conventionally used 50Ω (American National Standards Institute (ANSI) has developed the standard measurement base for a transmission line of 50Ω characteristic impedance), then the characteristic impedance of the transmission line is needed so as to get the reference impedance of the transmission line through the following equation by using the direct current resistance measurement value in the offset shunt device calibrator, thus finally acquiring the scattering parameter of the actual tested object with the reference impedance of 50Ω.

$$Z_C = \gamma/(j2\pi fC) \quad (8)$$

$$C = Re\left\{-\frac{(1+S_{22})\gamma}{j4\pi f S_{22} R_{dc,shunt}}\right\}\bigg|_{f<1\,GHz} \quad (9)$$

It should be noted that the present invention allows to use the direct current resistance measurement values of the offset series device calibrator and the offset shunt device calibrator to determine the propagation constant of the transmission line thereby eliminating the problem of poor numerical calculations in case of low frequency operations; meanwhile, it is also possible to use the high frequency parasitic effect devices $y_{sp}$, $z_{tp}$ of the offset series device calibrator and the offset shunt device calibrator to resolve the problem of poor numerical calculations in self-calibration operations when the LINE phase shift approaches 180 degrees and integer times thereof thereby successfully achieving the effect of wideband calibration measurement.

Compared with prior art, the calibration method for radio frequency scattering parameter measurement provided by the present invention can offer the following advantages:

1. the present invention enables improvement in accuracy of scattering parameter measurements and execution of de-embedding process in the one-tier measurement of radio frequency scattering parameter for semiconductor wafer devices or other substrate devices;

2. the present invention can provide an L-OS-OT calibration method to perform wideband measurements and also use the known conditions offered by the calibrators to solve the same or more number of unknown variables thereby achieving the objective of self-calibration;

3. the calibration method according to the present invention features convenience in fabrication with simplicity, so it is not required to apply expensive materials, but only exploit the characteristics of series and shunt resistor connections for calibrating to a sufficient frequency bandwidth, and all characteristic parameters can be obtained though the self-calibration process as well.

By way of the aforementioned detailed descriptions for the preferred embodiments according to the present invention, it is intended to better illustrate the characters and spirit of the present invention rather than restricting the scope of the present invention to the preferred embodiments disclosed in the previous texts. Contrarily, the objective is to encompass all changes and effectively equivalent arrangements within the scope of the present invention as delineated in the following claims of the present application.

What is claimed is:

1. A measurement structure for radio frequency scattering parameter measurement applying three calibrators which uses a microwave probe as a contact interface for microwave signal transmissions, wherein the microwave probe includes at least a ground end and a signal end, and the measurement structure for radio frequency scattering parameter measurement applying three calibrators comprises:

a transmission line segment calibrator, in which the microwave probe contacts the transmission line segment calibrator, and the transmission line segment calibrator consists of two transmission lines and a transmission line segment, in which the transmission line segment is connected between the two transmission lines, and the transmission lines are connected to the signal end of the microwave probe thereby performing measurements on device characteristics of the transmission line segment;

an offset series device calibrator, in which the microwave probe contacts the offset series device calibrator, and the offset series device calibrator consists of two transmission lines, an offset transmission line and a series resistor, in which the offset transmission line and the series resistor are connected between the two transmission lines, and the transmission lines are connected to the signal end of the microwave probe;

an offset shunt device calibrator, in which the microwave probe contacts the offset shunt device calibrator, and the offset shunt device calibrator consists of two transmission lines, an offset transmission line and a shunt resistor, in which the offset transmission line and the shunt resistor are connected between the two transmission lines, and the transmission lines are connected to the signal end of the microwave probe; and a tested object measuring instrument, in which the microwave probe contacts the tested object measuring instrument, and the tested object measuring instrument consists of two transmission lines and a tested device, in which the tested device is connected between the two transmission lines and the transmission lines are connected to the signal end of the microwave probe thereby performing measurements on device characteristics of the tested device.

2. The measurement structure for radio frequency scattering parameter measurement applying three calibrators according to claim 1, wherein a length of the transmission lines for the offset series device calibrator and a length of the transmission lines of the offset shunt device calibrator are equal to a length of the transmission lines for the tested object measuring instrument.

3. The measurement structure for radio frequency scattering parameter measurement applying three calibrators according to claim 1, wherein a length of the offset transmission line for the offset series device calibrator is equal to or different from a length of the offset transmission line for the offset shunt device calibrator.

4. The measurement structure for radio frequency scattering parameter measurement applying three calibrators according to claim 1, wherein the transmission line segment calibrator, the offset series device calibrator, the offset shunt device calibrator and the tested object measuring instrument are capable of using a microstrip or coplanar waveguide as a connection transmission line.

5. The measurement structure for radio frequency scattering parameter measurement applying three calibrators according to claim 1, wherein the microwave probe is a type of high frequency probe which can be characterized as G-S-G-S-G, G-S-S-G, G-S-G or G-S.

\* \* \* \* \*